United States Patent
Martinez et al.

(10) Patent No.: US 6,807,209 B2
(45) Date of Patent: Oct. 19, 2004

(54) CONTROLLING THE EXTINCTION RATIO OF OPTICAL TRANSMITTERS

(75) Inventors: Christopher G. Martinez, Portland, OR (US); Qingsheng Tan, Portland, OR (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 96 days.

(21) Appl. No.: 10/086,162

(22) Filed: Feb. 26, 2002

(65) Prior Publication Data

US 2002/0141466 A1 Oct. 3, 2002

Related U.S. Application Data

(60) Provisional application No. 60/279,777, filed on Mar. 30, 2001.

(51) Int. Cl.$^7$ .................................................. H01S 3/00
(52) U.S. Cl. .................................................. 372/38.02
(58) Field of Search .......................... 372/38.1–38.09, 372/33, 25

(56) References Cited

U.S. PATENT DOCUMENTS

| | | | | |
|---|---|---|---|---|
| 4,689,795 A | * | 8/1987 | Yoshimoto et al. | 372/31 |
| 6,014,235 A | | 1/2000 | Norte | 359/109 |

* cited by examiner

Primary Examiner—Quyen Leung
(74) Attorney, Agent, or Firm—Perkins Coie LLP

(57) ABSTRACT

A system and method for stabilizing an extinction ratio for an optical transmitter that uses a laser diode that is modulated by a laser driver, the scheme having a modulating current and a bias current, wherein a portion of the bias current is fed forward into the modulating current to stabilize the extinction ratio and thereby improve a laser's performance over time and with increases in temperature.

17 Claims, 5 Drawing Sheets

CONTROLLING THE EXTINCTION RATIO OF OPTICAL TRANSMITTERS

CROSS REFERENCE TO RELATED APPLICATIONS

This application claims priority from Martinez et al.'s provisional application U.S. Ser. No. 60/279,777, filed on Mar. 30, 2001, entitled "Method and Apparatus for Controlling the Extinction Ratio of Optical Transmitters," incorporated herein by reference.

BACKGROUND OF THE INVENTION

There are various kinds of optical transmitters. One method of producing an optical transmitter is to directly modulate a laser diode using a laser driver. Laser drivers provide a means to switch currents in and out of laser diodes. These currents are typically driven at high data rates and are set and controlled by the laser driver for optimum performance of laser operation.

As will be appreciated by those skilled in the art, the characteristics of a laser diode change over time and with temperature. Well designed laser drivers attempt to compensate for these changes through adjustments in diode currents. To avoid laser turn-on and turn-off delays in light emission for high speed operation, a bias current, which is typically higher than the threshold current of the laser diode, is generally supplied to the laser diode. As is known in this field, when the bias current significantly exceeds the threshold value, the extinction ratio of the optical emission rapidly deteriorates, resulting in a receiver sensitivity penalty for signal transmission.

The extinction ratio of an optical signal is a ratio of the amount of optical power that is transmitted during a "1/on" period to the amount of optical power that is transmitted during a "0/off" period. In other words, the extinction ratio is the ratio of the optical-energy level of a binary "1" to that of a binary "0" level of a modulated signal. If the laser characteristics change over time and temperature with no compensation provided by the laser driver, the extinction ratio will decrease and the optical system performance will degrade, showing increased error rates. In most circumstances, a desirable extinction ratio is generally about 8.2 dB or better.

A standard laser driver has an Imod current, which is switched in and out of the laser diode providing a means to transmit a "1/on" or "0/off" signal. The optical output of the laser is therefore P1 when on, and P0 when off. The current which supplies power to the laser driver is called the modulation current Imod, and bias current Ibias.

The Ibias value sets the base line current for the laser when it is off, which is therefore the P0. The Imod current is turned on through a data input, electrically coupled to a first and second transistors and provides enough current to turn the laser on, the P1 setting. An extinction ratio is simply the ratio of P1 over P0.

PRIOR ART FIG. 1 depicts a typical laser driver 10. The laser driver 10 includes a photocurrent source, Iphoto 4, and a current source 5. A laser 1 emits light 2 to a photo current monitor 3. The photo current, Iphoto 4, is set by a user. The Imod current source 5 is controlled by the input of data through an input switch 6, which is sent through transistors 7 in a well known fashion. A block 9 is used to set an Ibias current 8. The total modulation current is simply the Imod current.

FIG. 2 graphically shows how either time or temperature decreases the extinction ratio of a laser diode of the prior art. The characteristics of laser diode optical output (vertical axis) versus laser current (horizontal axis) for an optimally functioning laser 20 has better performance and a steeper slope than a laser which is below optimal level 21 due to problems such as hysteresis or changes in the operating temperature. The optical output power at 1 versus 0 is represented by P1 and P0 for the optimal laser and P1' and P0' for the less functional laser. Both states of the laser have the same average optical output due to the feedback caused by the Ibias circuitry (see elements 9 and 10 of FIG. 1). The actual levels of power at 1, P1 and P1' respectively, differ because of this feedback loop. So as a result the extinction ratio, which is power at 1 over power at 0 (P1/P0), gets smaller as the laser loses efficiency.

Typically, laser drivers do not compensate for the extinction ratio. Laser drivers that do are complex and require expensive peak detectors.

Some attempts to compensate for the extinction ratio can be found, for example, in U.S. Pat. No. 6,014,235. In that patent there is taught an optical-loop buffer that mitigates the reduction in the buffered signal's extinction ratio and substantially restores (e.g., maintains or increases) the buffered signal's extinction ratio to its original value, thereby extending the number of circulations, and hence the storage time, for which the buffered signal can remain in the buffer without the extinction ratio falling below an acceptable minimum. The optical buffer restores the extinction ratio of the buffered signal and thereby extends the length of time for which the signal can be stored. However this approach uses a complex assembly of optical components and as a result, can not be easily implemented into an existing circuit due its size and complexity.

Accordingly, what is needed is a simpler way to compensate for the deterioration of the extinction ratio and not add to circuit complexity.

SUMMARY OF THE INVENTION

It is a purpose of the present invention to provide a simplified scheme to control the extinction ratio of laser transmitters.

A standard laser driver controls laser operation through the use of an Imod current, which is switched in and out of the laser diode providing a means to transmit a "1/on" or "0/off". The Imod current can be controlled and set externally. An Ibias current is then used to control the average current in the laser and compensates for increases in a laser's threshold current by having its current increased, while the Imod current itself does not change. However, when this is done, the extinction ratio is reduced since there is no compensation for decreases in laser's slope efficiency. The present invention compensates for decreases in the extinction ratio by feeding forward a portion of the Ibias current to the Imod current source. The percentage of the portion being fed forward can be controlled externally by a user to compensate for changes in the laser. Therefore the Imod total becomes a function of the set Imod current and some portion of the Ibias current. This controls the extinction ratio by making the optical output power in the "1/on" state, when the laser is at a higher temperature, almost the same as that as when it is functioning normally. The extinction ratio can therefore be stabilized by using embodiments of this invention.

Preferably the portion of the Ibias current being fed forward to the Imod current is between 30–200%.

One advantage of the present invention is that it prevents deterioration of the extinction ratio. Another advantage is that the maintenance of the extinction ratio is accomplished with a minimal modification of an existing circuit and therefore is economical.

These and other advantages of the present invention will become apparent to those skilled in the art upon a reading of the following descriptions and a study of the various FIGS. of the drawing.

DETAILED DESCRIPTION OF THE PREFERRED EMBODIMENT(S)

Figure 1:
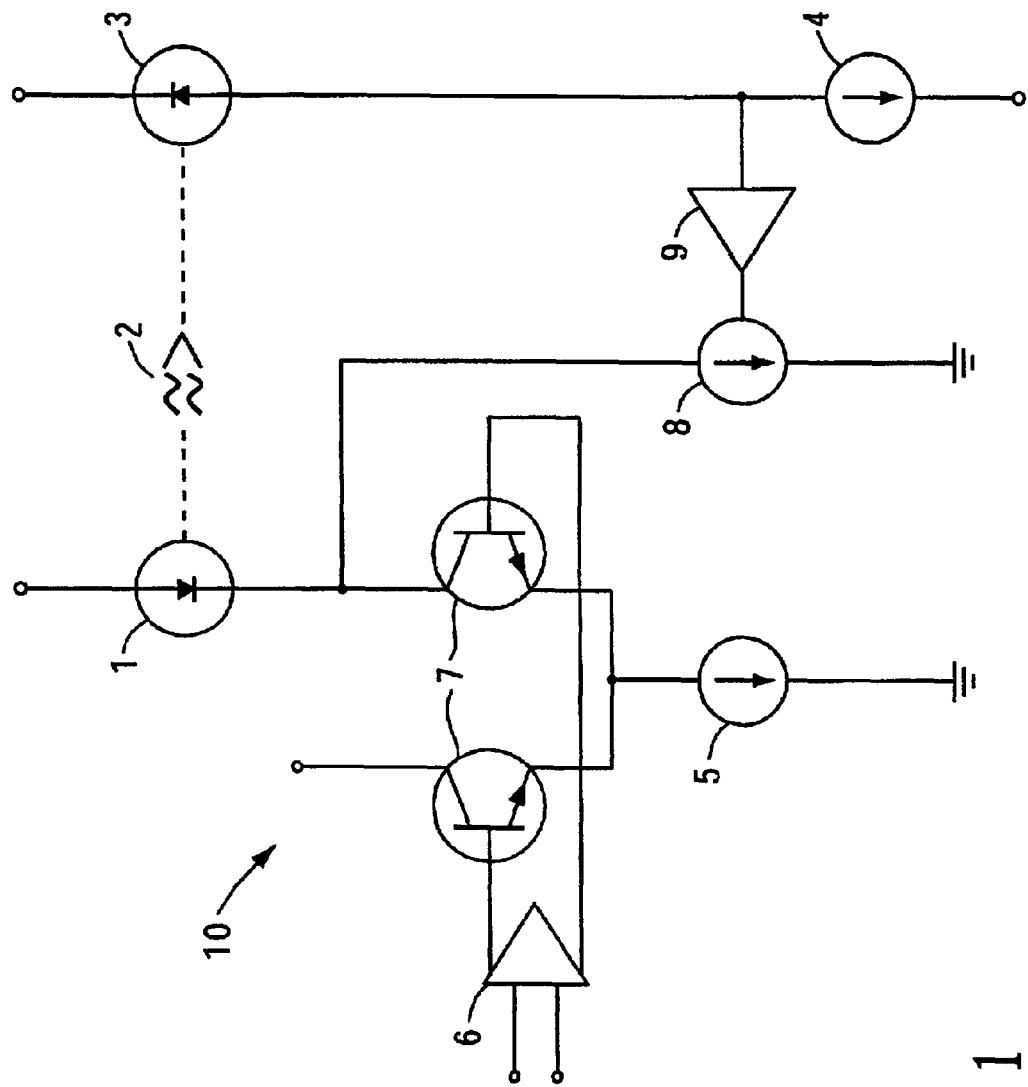
FIG. 1 is a diagram of a laser diode of the prior art.
Figure 2:
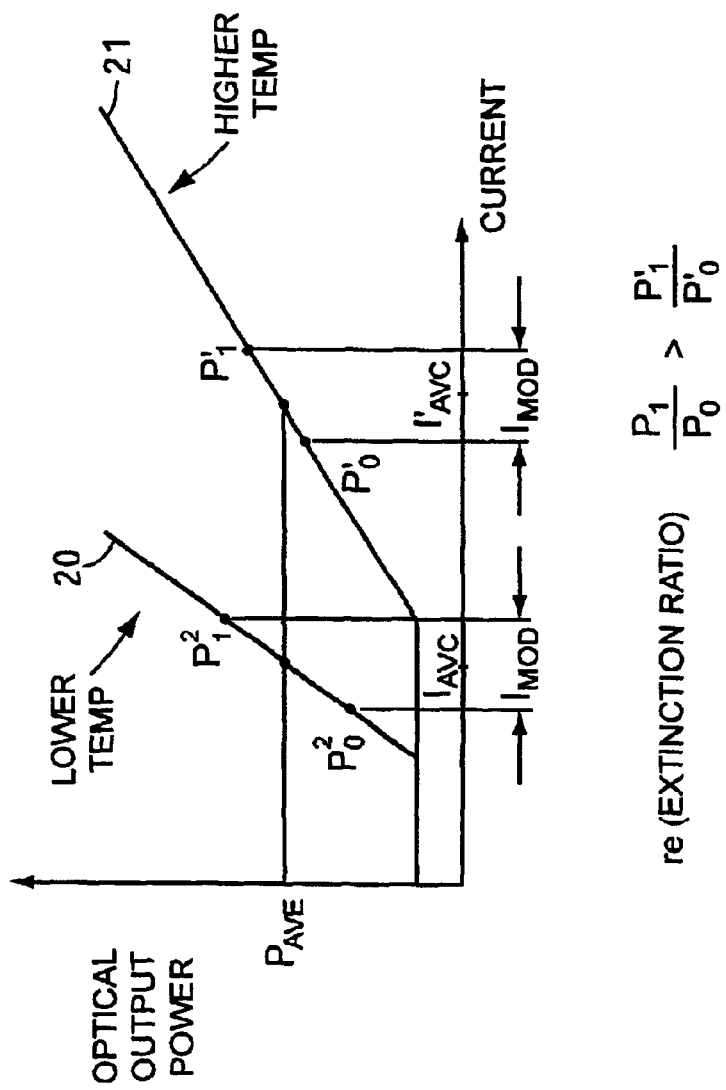
FIG. 2 is a chart of a laser diode curve according to the prior art.

FIGS. 1 and 2 were previously described in relation to the prior art.

Figure 3:
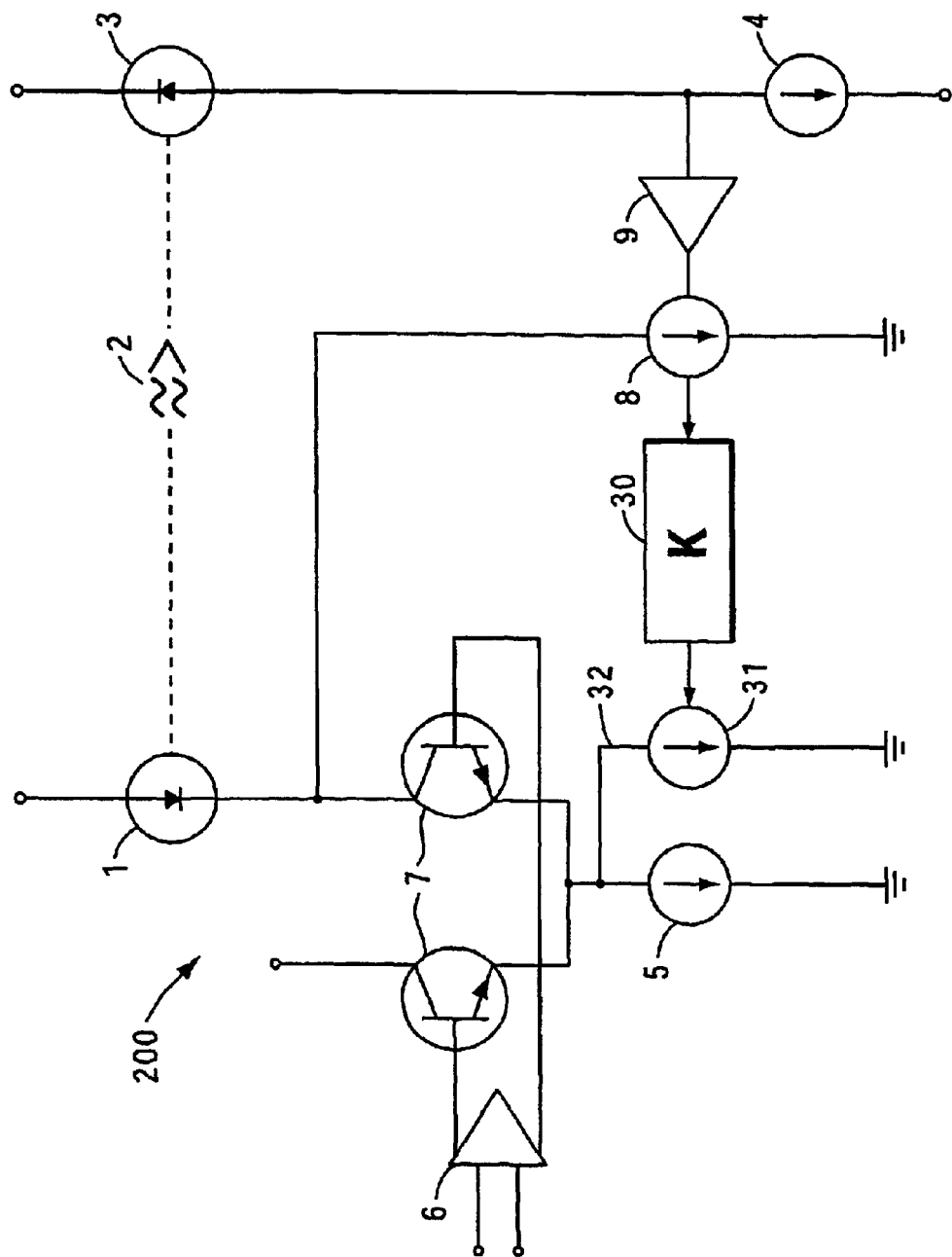
FIG. 3 shows one embodiment of the invention as feeding forward a portion of the Ibias current to the Imod current.

FIG. 3 shows one embodiment of how the present invention helps to keep the extinction ratio constant. A portion of the Ibias current 30 set by a user is fed forward into the current controlling the laser 31. Therefore, the Imod total becomes the set Imod plus a percentage of the Ibias. The percentage of the Ibias current fed forward to the I-mod current source K, can be set by the user 30 and can be any percentage, but is preferably between 30 and 200 percent of the Ibias current. The embodiment in FIG. 3 shows the (K*Ibias) current value fed forward to a second current source 31 electrically coupled in parallel to the first I-mod current source 5; essentially a branch in the second current source 31 is a branch arm 32. In this embodiment the (K*Ibias) current 30 is fed forward into the second current source 31, but it can also be fed forward into the first Imod current source, or in other manner which will be equally apparent to one of ordinary skill in the art.

The Imod current may be almost any conceivable current value set by the user, restricted only by the operating parameters of the first and second transistor 7 and the diode laser. Most laser systems, though, would operate within a range of between 2 and 100 milliamps, though a particularly preferred embodiment is approximately 40 milliamps. At this level, the Ibias current value fed forward by the present invention would preferably be set at approximately 10 milliamps. The preferred range of the (K*Ibias) current value would therefore be from 3 to 20 milliamps.

Figure 4:
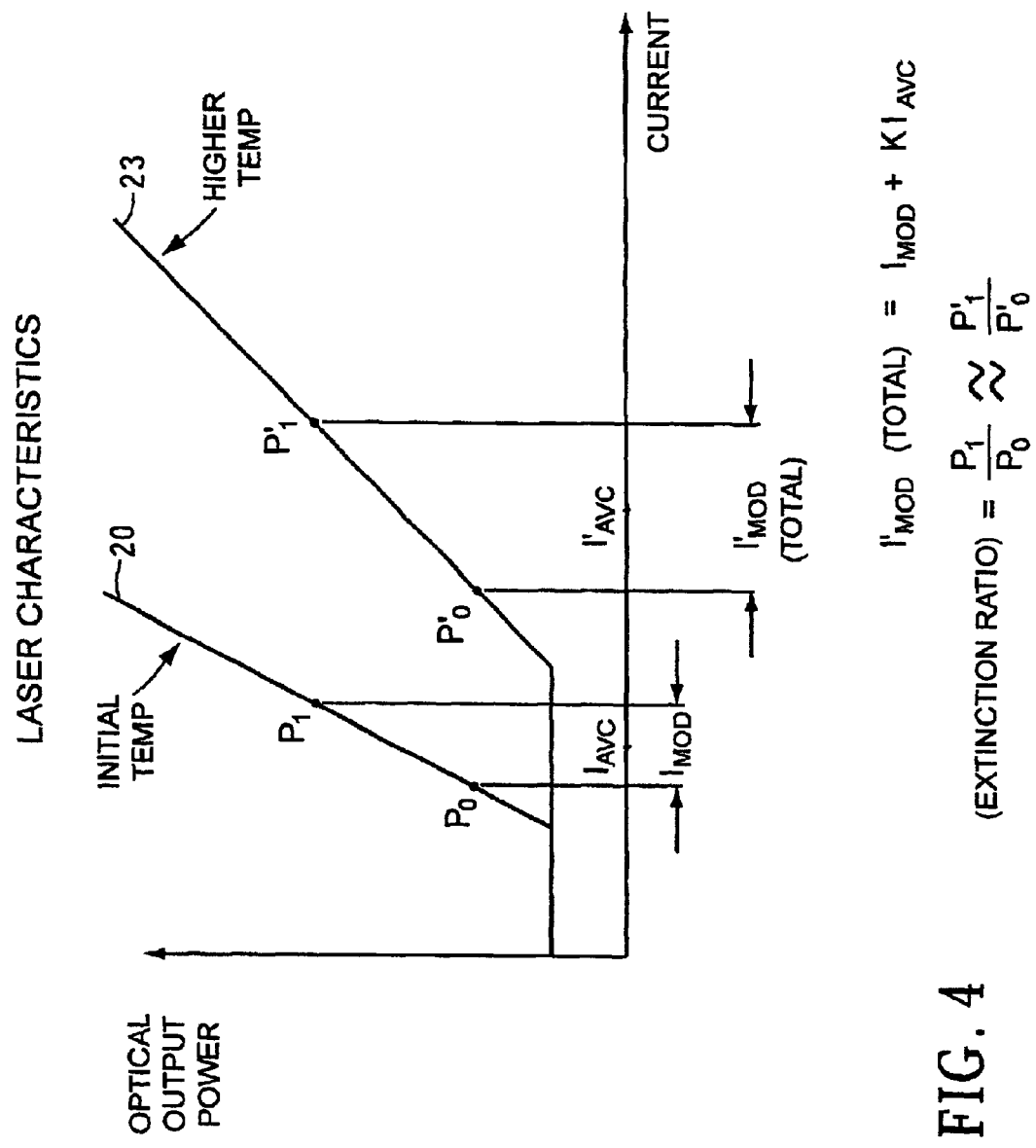
FIG. 4 shows a diagram of how the present invention improves performance over the prior art.

FIG. 4, graphically shows how the extinction ratio is kept more constant by this invention. The characteristics of laser diode optical output (vertical axis) versus laser current (horizontal axis) for a laser, which is below optimal level 23 due to problems such as aging or the changing of the operating temperature, now has a performance and slope more equal to that of an optimally functioning laser 20. The extinction ratio, which is power at 1 over power at 0 (P1/P0), is now kept a more constant level over time and temperature.

Figure 5:
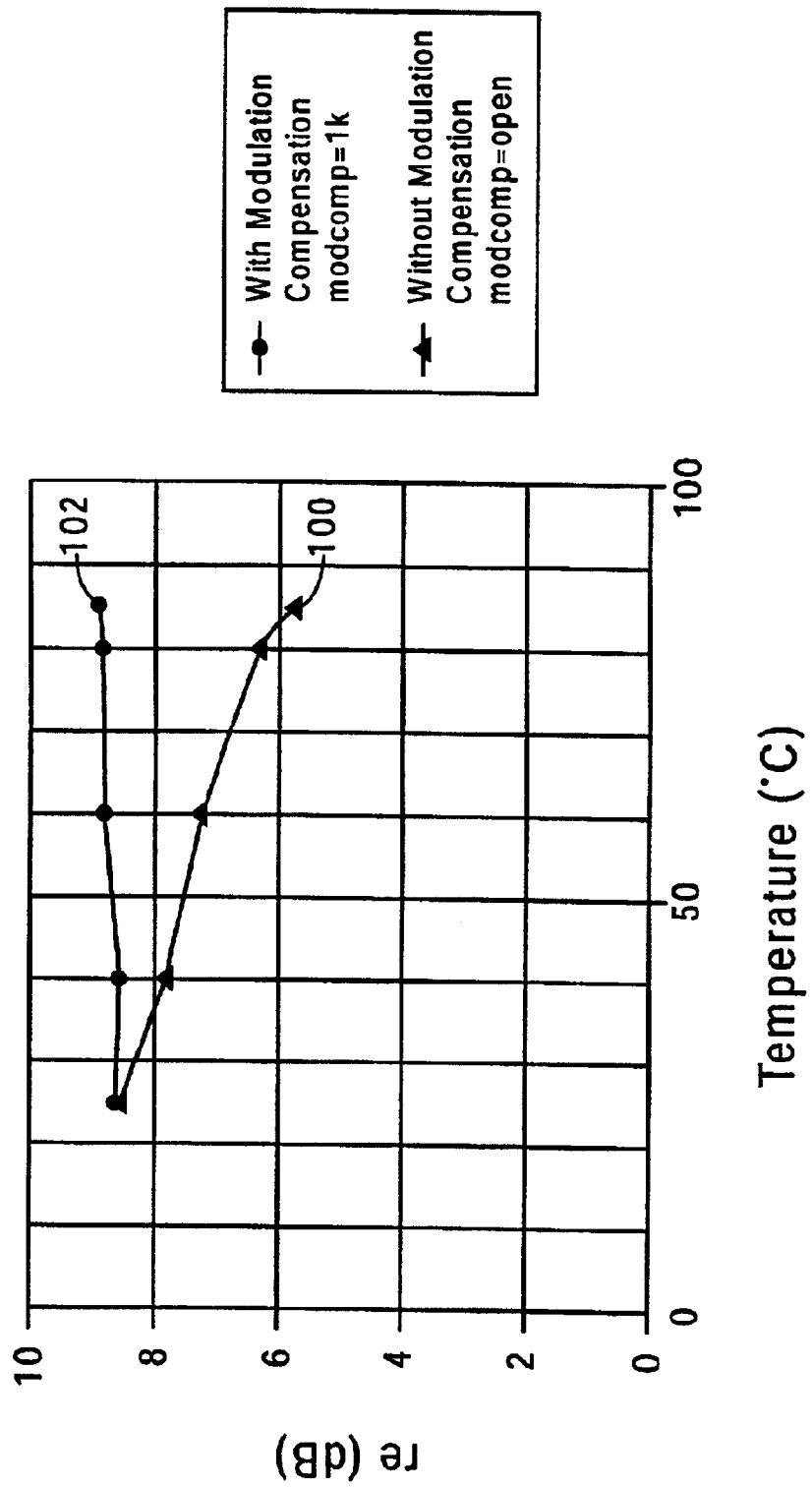
FIG. 5 is a diagram that shows the behavior of the extinction ratio versus temperature with and without modulation compensation used in the present invention.

FIG. 5 is a diagram that shows the behavior of the extinction ratio versus temperature with and without the modulation compensation used in the present invention. As can be seen, if modulation compensation of the present invention is not used, the extinction ratio decays with increasing temperature (curve 100). When modulation compensation is applied (curve 102), the extinction ratio advantageously remains more or less constant with increasing temperature.

In view of the foregoing, it will be appreciated that the present invention prevents deterioration of the extinction ratio. Additionally, the maintenance of the extinction ratio is accomplished with a minimal modification of an existing circuit and therefore the implementation is economical.

While various embodiments have been described above, it should be understood that they have been presented by way of example only, and not limitation. Thus, the breadth and scope of a preferred embodiment should not be limited by any of the above described exemplary embodiments, but in accordance with the true spirit and scope of the invention.

Other embodiments are within the following claims.

What is claimed is:

1. A laser driver generating an Imod current and an Ibias current, said laser driver characterized in that a portion of said Ibias current is fed forward to said Imod current.

2. A laser driver according to said claim 1, wherein said portion of said Ibias current being fed forward to said Imod current is predetermined by a user.

3. A laser driver according to claim 2, wherein said Imod current is produced by a first Imod current source, said first Imod current source electrically coupled in parallel to a second Imod current source and said portion of said Ibias current being fed forward to said Imod current is fed into only said second of said at least two Imod current sources.

4. A laser driver according to claim 1, wherein said Imod current is produced by a first Imod current source, said first Imod current source electrically coupled in parallel to a second Imod current source and said portion of said Ibias current being fed forward to said Imod current is fed into only said second of said at least two Imod current sources.

5. A laser driver according to claim 3, wherein said portion of said Ibias current being fed forward to said Imod current is between 30–200%.

6. A laser system comprising:

a laser;

a laser driver generating an Imod current and an Ibias current for controlling said laser, said laser driver characterized in that a portion of said Ibias current is fed forward to said Imod current; and wherein said Ibias current feed forward decreases an extinction ratio said laser driver.

7. A laser system according to said claim 6, wherein said portion of said Ibias current being fed forward to said Imod current is predetermined by a user.

8. A laser system according to claim 7, wherein said Imod current is produced by a first Imod current source, said first Imod current source electrically coupled in parallel to a second Imod current source and said portion of said Ibias current being fed forward to said Imod current is fed into only said second of said at least two Imod current sources.

9. A laser driver according to claim 6, wherein said Imod current is produced by a first Imod current source, said first Imod current source electrically coupled in parallel to a second Imod current source and said portion of said Ibias current being fed forward to said Imod current is fed into only said second of said at least two Imod current sources.

10. A laser system according to claim 8, wherein said portion of said Ibias current being fed forward to said Imod current is between 30–200%.

11. A method of controlling an extinction ratio of a laser driver comprising an Imod current and an Ibias current, said method comprising an act of feeding forward a portion of said Ibias current to said Imod current.

12. A method of controlling an extinction ratio of a laser driver according to claim 11, further comprising an act of enabling a user to control said portion of said Ibias current being fed forward to said Imod current.

13. A method of controlling an extinction ratio of a laser driver according to claim 11, said method further comprising acts of:

produce said Imod current by a first Imod current source electrically coupled in parallel to a second Imod current source; and feeding forward said portion of said Ibias current into only said second of said Imod current sources.

14. A method of controlling an extinction ratio of a laser driver according to claim 11, wherein said portion of said Ibias current being fed forward to said Imod current is between 30–200%.

15. A system for stabilizing an extinction ratio of an optical transmitter comprising:

a laser diode driver;

a photo monitor;

an I-mod current that controls an on and off state of said laser diode driver;

an I-bias current that provides a base line power level to said laser diver, creating an extinction ratio; and wherein a portion of said I-bias current is fed forward into said I-mod current, whereby said extinction ratio is stabilized.

16. A system for stabilizing an extinction ratio of an optical transmitter as in claim 15, wherein said portion of said I-bias current being fed forward into said I-mod current is fed forward into a branch arm.

17. A system for stabilizing an extinction ratio of an optical transmitter as in claim 15, wherein said portion of said I-bias current being fed forward into said I-mod current is between 30 and 200 percent.

* * * * *